United States Patent [19]
Chikyou et al.

[11] Patent Number: 5,748,360
[45] Date of Patent: May 5, 1998

[54] DECELERATING AND FOCUSING ION BEAM DEVICE

[75] Inventors: Toyohiro Chikyou; Nobuyuki Koguchi, both of Ibaraki, Japan

[73] Assignee: National Research Institute for Metals, Tsukuba, Japan

[21] Appl. No.: 610,232

[22] Filed: Mar. 4, 1996

[30] Foreign Application Priority Data

Mar. 6, 1995 [JP] Japan ................................. 7-045647

[51] Int. Cl.$^6$ .............................. G02B 26/08; G01K 1/08
[52] U.S. Cl. ..................... 359/298; 250/398; 250/492.2; 250/492.21; 250/396 R
[58] Field of Search ........................ 359/298; 250/492.2, 250/492.21, 398, 396 R

[56] References Cited

U.S. PATENT DOCUMENTS

| | | | |
|---|---|---|---|
| 4,563,587 | 1/1986 | Ward et al. | 250/396 R |
| 4,680,469 | 7/1987 | Nomura et al. | 250/398 |
| 4,687,940 | 8/1987 | Ward et al. | 250/492.2 |
| 4,713,543 | 12/1987 | Feuerbaum et al. | 250/398 |
| 5,393,985 | 2/1995 | Yamakage et al. | 250/398 |
| 5,504,340 | 4/1996 | Mizumura et al. | 250/492.21 |
| 5,539,203 | 7/1996 | Ohdomari | 250/492.21 |
| 5,574,280 | 11/1996 | Fujii et al. | 250/492.21 |

FOREIGN PATENT DOCUMENTS 4-272642 9/1992 Japan .

*Primary Examiner*—Loha Ben
*Attorney, Agent, or Firm*—Wenderoth, Lind & Ponack

[57] ABSTRACT

A decelerating and focusing ion beam device is provided with an ion source, a focusing lens system having a plurality of focusing lenses and a multiple decelerating lens system having a plurality of decelerating lenses. It is possible to realize selective super-refined crystal growth and superficial etching with very high accuracy.

5 Claims, 2 Drawing Sheets

DECELERATING AND FOCUSING ION BEAM DEVICE

FIELD OF THE INVENTION

This invention relates to a decelerating and focusing ion beam device. More particularly, this invention relates to a decelerating and focusing ion beam device applicable to technology such as selective growth of super-refined crystals on a substrate or fine working of several electronic microdevices.

DISCLOSURE OF THE PRIOR ART

As microelectronics technology has made rapid progress, various research for technology such as selective growth of crystals on a semiconductor substrate or very fine etching are being conducted. The development of this technology has attracted general attention so far.

Decelerating and focusing ion beam technology derived from focusing ion beam technology belongs to this technology.

This decelerating and focusing ion beam technology relates to a manner in which ions are directly deposited on the surface of a substrate as a working object by radiating ion beams decelerated on the substrate. An assembly device in which a decelerating mechanism is provided for a focusing ion beam device has conventionally been developed to realize such a manner. This assembly device has a structure consisting of a focusing ion beam device and a decelerating grid adopted as the decelerating mechanism.

The conventional assembly device, however, has several essential defects originating from the structure itself. That is, because the decelerating grid is employed for a decelerating mechanism of this assembly device, focusing of ion beams is so incomplete that the diameter of these ion beams is widened and therefore scattered beams are generated. The application of bias to a substrate leads to undesirable phenomena, for example, the diameter of ion beams is extensively deformed, or secondary electrons collide with the surface of the substrate. When the assembly device with a liquid gallium ion source is applied to a production of gallium (Ga) liquid droplets or gallium arsenide (GaAs) crystal, the diameter of ion beams is widened about 200 μm. Furthermore, the electric potential level of the substrate in the assembly device is at a ground level. This makes it difficult to combine with some other peripheral devices.

SUMMARY OF THE INVENTION

This invention has an object to prevent the diameter of ion beams from being broadened.

This invention has another object to keep secondary electrons generated in the vicinity of the substrate from colliding with the substrate.

This invention has a further object to provide a decelerating and focusing ion beam device capable of connecting with peripheral devices without any difficulty.

These and other objects, features and advantages will be more apparent by reading the following specification and accompanying drawings.

DETAILED DESCRIPTION OF THE INVENTION

This invention provide a device for decelerating and focusing ion beams, comprising an ion source, a focusing lenses system having a plurality of focusing lens and a multiple decelerating lens system having a plurality of decelerating lenses.

This invention also provides several modifications in which:

Electric circuits connected with the ion source, focusing lens system and multiple decelerating lens system are independent of each other; electric potential of a substrate is at a ground level; a deflecting lens for scanning is disposed between the focusing lens system and the multiple decelerating lens system; a multichannel plate for detecting secondary electrons is provided so as to face the substrate; the ion source is a liquid metal source; and at least one kind of particles selected from the group consisting of atoms, molecules and ions are deposited on the substrate.

The decelerating and focusing ion beam device of this invention has a significant structural feature in that ion beams are decelerated through the multiple decelerating lens system provided for a plurality of decelerating lenses and circuits of these decelerating lenses are independent of each other. Possible stigmatic structures may be adopted as decelerating electrodes in the multiple decelerating lens system.

Figure 1:
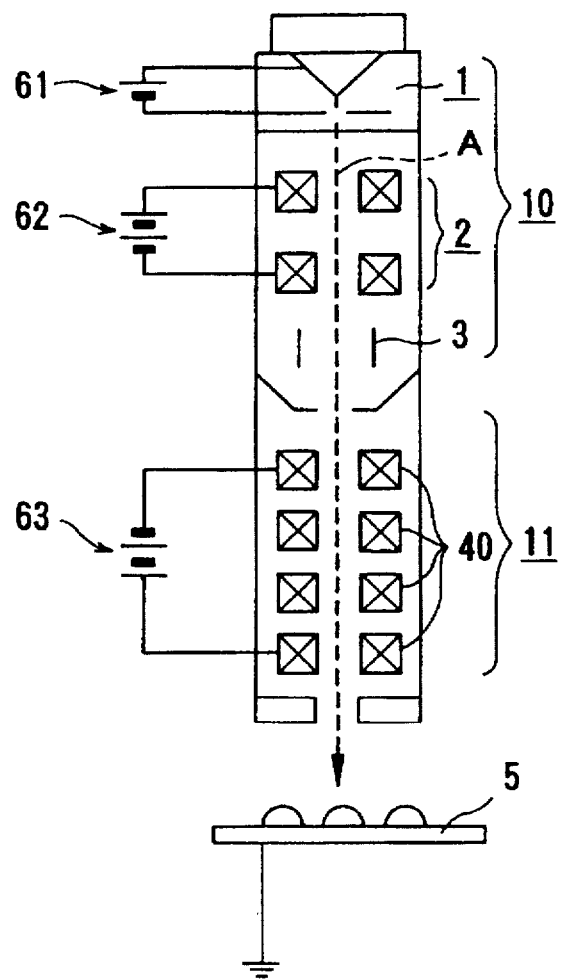
FIG. 1 is a schematic view depicting a typical configuration of a decelerating and focusing ion beam device.

FIG. 1 depicts a typical configuration of a device of this invention. The device can be divided into two partial portions consisting of a focusing portion (10) and a decelerating portion (11). An ion source such as a liquid metal source (1), a focusing lens system (2), and a deflecting lens (3) for scanning are provided for the focusing portion (10). The decelerating portion (11) is provided with a multiple decelerating lens system consisting of a plurality of decelerating lenses (40). Ion beams such as gallium ion beams (A) are produced in the liquid metal source (1). The focusing lens system (2) makes these ion beams thin until their diameter becomes a prescribed size. The ion beams thus-arranged are launched while their direction is controlled by the deflecting lens (3) for scanning. The ion beams (A) are accelerated in line with electric potential difference given by electric power supplies (61) and (62) connected with the liquid metal ion source (1) and the focusing lens system (2), respectively.

In the decelerating portion (11), a bias reverse to that of the focusing lens system (10) in electric potential is applied to each of the decelerating lenses (40) by an electric power supply (63). The ion beams (A) are decelerated by this reverse bias. Shapes of all the decelerating lenses (40) disposed in a body tube are considered not to bring about large distortion either in shapes or orbit of the ion beams (A). Since deceleration of the ion beams (A) is conducted by the decelerating lenses (40) in the body tube, the width of the ion beams (A) is restricted so sufficiently that it is possible to prevent the ion beams (A) from widening beyond the prescribed width.

Figure 2:
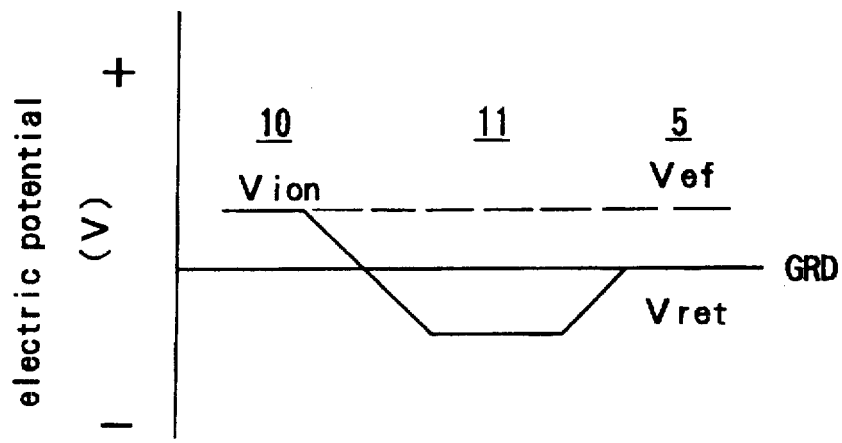
FIG. 2 is a diagram depicting a change of electric potential along locations of an ion in the device.

An electric circuit including the electric power supply (63) which is connected with all the decelerating lenses (40) is divided away from the others. Besides, the substrate (5) is kept at a ground level as shown in FIG. 2. These structures eliminate the change of an electronic state on the surface of the substrate (5) accompanied by the collision with the substrate (5) of secondary electrons which are generated in the vicinity of the substrate (5). Any combination with some other peripheral devices is easily realized because the substrate (5) is kept at the ground level.

With regard to molecules and atoms deposited on the substrate by the conventional film forming technology, the amount of their dynamic energy has been determined by the deposition manner adopted. Such dynamic energy may, on the other hand, be changeable and be set at an arbitrary value by using this device. Any fine structure may possibly be directly drawn on the substrate.

This device makes possible etching with a high level of accuracy as well as deposition including selective growth of super-refined crystals on the substrate with high accuracy.

Now, some embodiments will be shown to explain this invention in more detail.

EMBODIMENTS

Figure 3:
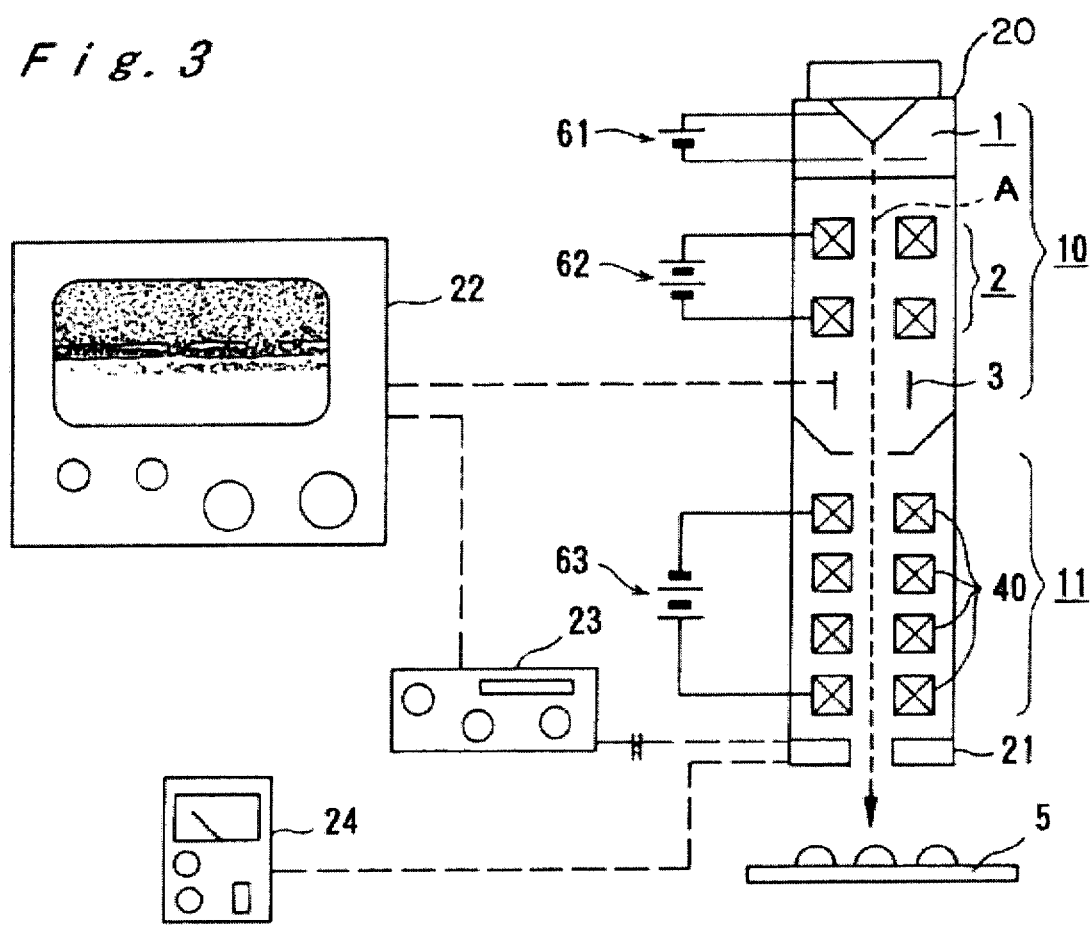
FIG. 3 is a schematic view depicting a configuration of an embodiment of the device.

FIG. 3 depicts a configuration of an embodiment of a decelerating and focusing ion beam device.

A liquid metal ion source (1), a focusing lens system (2) provided for a plurality of focusing lenses, a deflecting lens (3) for scanning, a decelerating lens system for detecting secondary electrons provided for a plurality of decelerating lenses (40), and a multichannel plate (21) are arranged in a body tube of a ultra-high-vacuum vessel (20). These structural elements are subsequently disposed from the top portion of the vessel (20). A display (22) for displaying secondary electrons, a pre-amplifier (23), a high-voltage power source (24) and a controller (not shown in FIG. 3) are also provided for the device.

The controller sends various signals to each decelerating lens (40). An electric circuit electrically independent of other circuits is connected with each decelerating lens (40). The multichannel plate (21) is disposed at the bottom of the body tube, which is able to detect secondary electrons flying from the surface of the substrate (5). Information on these secondary electrons thus-obtained is sent to the display (22).

Super-refined GaAs crystals were, for example, produced by this decelerating and focusing ion beam device. At first, gallium ion beams were derived from a liquid gallium ion source (1) at the voltage of about 8.0 KV. While ions were accelerated until the energy value reached 10.0 KV in the focusing lens system (2), the diameter of the ion beams was focused by 80 nm. The ion beams thus-obtained were emitted at the effective energy of 10–200 V to a gallium-arsenide substrate through four decelerating lenses (40) to which a bias of 9.8 KV was applied. The ion current value was 5–1000 pA. The radiation time was changed from 10 sec. to a quarter min. Gallium liquid drops with various sizes from 100 nm to 3 μm were observed on the GaAs substrate. It is possible to control the size of these Ga drops by arranging both ion current value and radiation time. GaAs super-refined crystals may possibly grow by radiating molecular beams of arsenic to these liquid drops.

Since electrodes for detecting are connected with the focusing lens system (2), the ion beams may possibly be scanned and moved with a prescribed interval. The super-refined GaAs crystals may possibly be disposed periodically.

Figure 4:
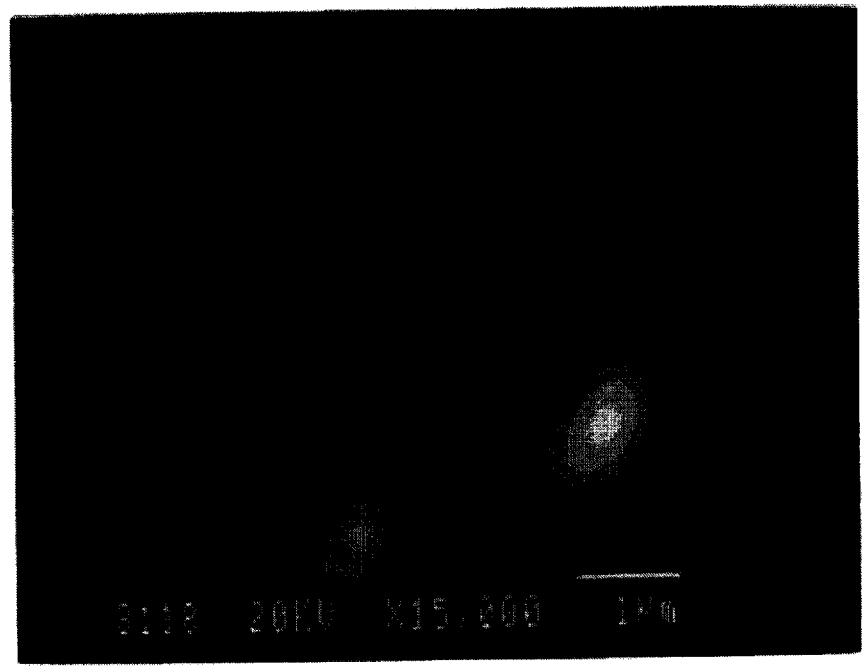
FIG. 4 is a photocopy showing an electron microscope image of secondary electrons of Ga liquid drops formed on the surface of a GaAs substrate.

FIG. 4 depicts an image of secondary electrons of the Ga liquid drops actually formed on the surface of the GaAs substrate. It is confirmed in this image that the Ga liquid drops with each size of 300 nm and 1 μm are periodically disposed. The deposition terms were as follows: ion current 800 pA; and deposition time 1 min and a quarter min, respectively.

As described in detail above, it is possible to grow super-refined crystals with higher accuracy than ever before. It is also possible to apply the ion beams of a low energy level to various fields in which the ion beams of a low energy level are utilized. The decelerating and focusing ion beam device is so simple both in principle and in structure that the device becomes low-priced and an applicable range of its use is widened. Therefore, it is hopeful that the device may be combined with various peripheral devices and employed for many purposes including deposition and etching.

It is needless to mention that this invention is not restricted to the embodiments described above.

What is claimed is:

1. A device for decelerating and focusing ion beams, said device comprising:

an ion source for producing ion beams;

a focusing lens system comprising a plurality of focusing lenses for thinning the ion beams produced by the ion source and accelerating the ion beams by an electric potential difference between said ion source and said focusing lens system;

a multiple decelerating lens system provided with a plurality of decelerating lenses for decelerating the ion beams;

and a deflecting lens, disposed between said focusing lens system and said multiple decelerating lens system, for controlling the advancing direction of the ion beams.

2. The device for decelerating and focusing ion beams as claimed in claim 1, further comprising a vacuum vessel having a body tube; wherein said ion source, said focusing lens system, said deflecting lens and said multiple decelerating lens system are respectively disposed from a top portion to a bottom portion in the body tube of the vacuum vessel.

3. The device for decelerating and focusing ion beams as claimed in claim 2, further comprising a substrate; wherein a multichannel plate for detecting secondary electrons is provided at the bottom portion of said body tube, and said multichannel plate faces said substrate.

4. The device for decelerating and focusing ion beams as claimed in claim 3, wherein an electric potential of the substrate is at a ground level.

5. The device for decelerating and focusing ion beams as claimed in claim 1, wherein said device is operable to directly deposit ions on a surface of a substrate having an electric potential at a ground level.

* * * * *